(12) United States Patent
Sakuda

(10) Patent No.: US 10,417,368 B2
(45) Date of Patent: Sep. 17, 2019

(54) SEMICONDUCTOR DEVICE AND LAYOUT DESIGN METHOD THEREOF

(71) Applicant: SEIKO EPSON CORPORATION, Tokyo (JP)

(72) Inventor: Takashi Sakuda, Kai (JP)

(73) Assignee: SEIKO EPSON CORPORATION, Tokyo (JP)

( * ) Notice: Subject to any disclaimer, the term of this patent is extended or adjusted under 35 U.S.C. 154(b) by 141 days.

(21) Appl. No.: 15/811,005

(22) Filed: Nov. 13, 2017

(65) Prior Publication Data

US 2018/0137231 A1   May 17, 2018

(30) Foreign Application Priority Data

Nov. 17, 2016 (JP) ................................ 2016-223854

(51) Int. Cl.
*G06F 17/50* (2006.01)
*H01L 27/02* (2006.01)

(52) U.S. Cl.
CPC ...... *G06F 17/5072* (2013.01); *G06F 17/5077* (2013.01); *H01L 27/0203* (2013.01); *H01L 27/0207* (2013.01)

(58) Field of Classification Search
USPC .................................. 716/110, 118, 119, 126
See application file for complete search history.

(56) References Cited

U.S. PATENT DOCUMENTS 6,732,344 B2    5/2004   Sakamoto et al.
7,456,660 B2 *  11/2008  Kurokawa .......... G06F 17/5045
                                              257/E27.111
7,818,702 B2 * 10/2010  Mandelman .... H01L 21/823878
                                              257/618
8,759,885 B1 *  6/2014   Jain ................... H01L 27/11807
                                              257/204
2008/0186059 A1  8/2008  Nozoe
2011/0222332 A1* 9/2011  Liaw ..................... G11C 11/412
                                              365/156

(Continued)

FOREIGN PATENT DOCUMENTS

JP     2003-133416 A    5/2003
JP     2008-192841 A    8/2008

*Primary Examiner* — Brian Ngo

(74) *Attorney, Agent, or Firm* — Oliff PLC

(57) ABSTRACT

A semiconductor device is provided in which, as a result of the number of tap cells being suppressed while the laying out of signal interconnects is made easier, the total layout area can be reduced. The semiconductor device includes: a first logic circuit cell including a plurality of impurity regions that are arranged in a first conductivity type first semiconductor layer and a second conductivity type second semiconductor layer; a first tap cell including a first contact region and a second contact region that are respectively arranged in the first and second semiconductor layers and have a longitudinal direction in a first direction; a second logic circuit cell including a plurality of impurity regions that are arranged in a first conductivity type third semiconductor layer and a second conductivity type fourth semiconductor layer; and a second tap cell including a third contact region and a fourth contact region that are respectively arranged in the third and fourth semiconductor layers and have a longitudinal direction in a second direction that is different from the first direction.

8 Claims, 7 Drawing Sheets

(56) References Cited

U.S. PATENT DOCUMENTS

| | | | |
|---|---|---|---|
| 2011/0284930 A1* | 11/2011 | Hershberger | G06F 17/5068 257/270 |
| 2013/0256748 A1* | 10/2013 | Clark, Jr. | H01L 21/823821 257/173 |
| 2013/0256749 A1* | 10/2013 | Clark, Jr. | H01L 21/845 257/173 |
| 2013/0258532 A1* | 10/2013 | Clark, Jr. | H01L 27/1211 361/56 |
| 2013/0299917 A1* | 11/2013 | Yang | H01L 27/0207 257/401 |
| 2013/0334613 A1* | 12/2013 | Moroz | G06F 17/5072 257/401 |

* cited by examiner

SEMICONDUCTOR DEVICE AND LAYOUT DESIGN METHOD THEREOF

BACKGROUND

This application claims the benefit of Japanese Patent Application No. 2016-223854, filed on Nov. 17, 2016. The content of the aforementioned application is incorporated herein by reference in its entirety.

1. Technical Field

The present invention relates to, in general, semiconductor devices, and specifically relates to a semiconductor device in which a layout is designed according to a standard cell method. Furthermore, the invention relates to a layout design method of such a semiconductor device.

2. Related Art

When a layout of a semiconductor device is designed according to a standard cell method, the placement and routing of circuit elements such as a MOS transistor is determined by the placing and connecting of a plurality of types of standard cells (logic circuit cells) that constitute a desired logic circuit using a CAD system or the like.

In general, a standard cell includes a P-channel MOS transistor to be placed in an N-well and an N-channel MOS transistor to be placed in a P-well. However, in the case where a region for contact to the N-well and a region for contact to the P-well are provided for each standard cell, the size of each standard cell increases, and the number of contact regions in the overall semiconductor chip becomes excessive, resulting in an increase in the layout area (chip size).

As a related technology, in JP-A-2003-133416 (Paragraphs 0011, 0014, 0023-0024, FIG. 2), a semiconductor integrated circuit is disclosed in which an increase in chip size and a decrease in resources for placement and routing on a chip can be suppressed. In this semiconductor integrated circuit, a first standard cell in which a substrate contact pattern is not placed and a second standard cell in which the substrate contact pattern is placed are placed so as to coexist, and a substrate contact for making contact to a substrate region of the standard cells is placed between desired standard cells.

In FIG. 2 in JP-A-2003-133416 (Paragraphs 0011, 0014, 0023-0024, FIG. 2), a substrate contact pattern 16 that is placed inside a standard cell 15, and a substrate contact pattern 21 that is added between a plurality of standard cells 10 are shown. The placement of the substrate contact patterns 21 are determined based on a rule that the substrate contact patterns 16 and 21 are substantially uniformly distributed in each cell row, a rule that current density in the well region is substantially uniform, or the like.

However, the substrate contact pattern 21 is placed immediately under a power supply interconnect (VCC interconnect) pattern 23 and a ground interconnect (VSS interconnect) pattern 24, and therefore the well region and the interconnect layer for these portions are occupied by the substrate contact, and the region for placing standard cells is reduced.

On the other hand, if the substrate contact pattern 21 is placed at a position that is separate from the interconnect patterns 23 and 24, the interconnect patterns 23 and 24 need to be extended to the position of the substrate contact pattern 21, and therefore the laying out of signal interconnects in an interconnect layer in which the interconnect patterns 23 and 24 are routed is limited.

SUMMARY

In view of the foregoing points, a first advantage of some aspects of the invention is to provide a semiconductor device in which, in the case where a tap cell for supplying power supply potential to a well and the like is provided separately from a standard cell (logic circuit cell), the total layout area can be reduced by suppressing the number of tap cells while the laying out of signal interconnects is made easier,. Also, a second advantage of some aspects of the invention is to provide a layout design method of such a semiconductor device.

A semiconductor device according to a first aspect of the invention includes: a first logic circuit cell including a plurality of impurity regions that are arranged in a first conductivity type first semiconductor layer and a second conductivity type second semiconductor layer; a first tap cell including a first contact region and a second contact region that are respectively arranged in the first and second semiconductor layers and have a longitudinal direction in a first direction; a second logic circuit cell including a plurality of impurity regions that are arranged in a first conductivity type third semiconductor layer and a second conductivity type fourth semiconductor layer; and a second tap cell including a third contact region and a fourth contact region that are respectively arranged in the third and fourth semiconductor layers and have a longitudinal direction in a second direction that is different from the first direction.

Note that, in the present application, the semiconductor layer refers to a semiconductor substrate, a well formed in the semiconductor substrate, or an epitaxial layer formed on the semiconductor substrate. Also, the first conductivity type may be N-type and the second conductivity may be P-type, or the first conductivity type may be P-type and the second conductivity may be N-type.

According to the first aspect of the invention, the first tap cell including the first and second contact regions that have a longitudinal direction in the first direction and the second tap cell including the third and fourth contact regions that have a longitudinal direction in the second direction are provided separate from the logic circuit cells. Therefore, for example, in the case where a plurality of cell rows extend in the first direction, while the laying out of signal interconnects is made easier by routing signal interconnects that extend in the first direction through the first tap cell, the number of second tap cells is reduced by placing the second tap cells in a staggered placement in a plurality of cell rows in other regions, and as a result, the total layout area can be reduced.

Here, the first tap cell may further include a first power supply interconnect and a second power supply interconnect that are arranged in parallel along the first direction, the first power supply interconnect being electrically connected to the first contact region, and the second power supply interconnect being electrically connected to the second contact region, and the second tap cell may further include a third power supply interconnect and a fourth power supply interconnect that are arranged in parallel along the first direction, the third power supply interconnect having a portion branched in the second direction so as to be electrically connected to the third contact region, and the fourth power supply interconnect having a portion branched in the second direction so as to be electrically connected to the fourth contact region.

Therefore, the first power supply interconnect is electrically connected to the first contact region via a plurality of contact holes formed in an interlayer insulating film side by side in the first direction, the second power supply interconnect is electrically connected to the second contact region via a plurality of contact holes formed in the interlayer insulating film side by side in the first direction, and in addition, the third power supply interconnect is electrically connected to the third contact region via a plurality of contact holes formed in the interlayer insulating film side by side in the second direction, and the fourth power supply interconnect is electrically connected to the fourth contact region via a plurality of contact holes formed in the interlayer insulating film side by side in the second direction, and as a result, the ability to supply power to a well or the like can be improved.

Also, the first tap cell is desirably placed in a region in which signal interconnects extending in the first direction are dominant over signal interconnects extending in the second direction. In such a region, signal interconnects that extend in the first direction can be routed so as to pass through the first tap cell, and the laying out of the signal interconnects can be made easier.

Alternatively, in the case where the semiconductor device further includes a macrocell and a plurality of input/output cells, the first tap cell may be placed in a region that is a region between the macrocell and the plurality of input/output cells or another macrocell, and has an aspect ratio that is greater than or equal to a predetermined value, or has a width that is less than or equal to a predetermined width. In such a region, signal interconnects that electrically connect the macrocell and the plurality of input/output cells or the other macrocell are routed through the first tap cell, and as a result, the laying out of signal interconnects can be made easier.

In that described above, a plurality of the first tap cells may be placed with a first predetermined interval at the same coordinates in the first direction, in a plurality of cell rows that extend in the first direction, and a plurality of the second tap cells may be placed alternatingly between two adjacent cell rows at a second predetermined interval, in a plurality of cell rows that extend in the first direction. Therefore, the laying out of signal interconnects is made easier by routing signal interconnects that extend in the second direction above a plurality of first tap cells, and the interval of the second tap cells in each cell row can be made twice the second predetermined interval.

A layout design method of a semiconductor device according to a second aspect of the invention is a layout design method of a semiconductor device that uses a first tap cell including a first contact region and a second contact region that have a longitudinal direction in a first direction, and a second tap cell including a third contact region and a fourth contact region that have a longitudinal direction in a second direction that is different from the first direction. The layout design method includes: (a) inputting placement information for designating a region in which a plurality of the first tap cells are to be placed; (b) placing the plurality of first tap cells in a layout region of the semiconductor device such that the first and second contact regions are respectively located in a first conductivity type semiconductor layer and a second conductivity type semiconductor layer, according to the placement information; (c) placing a plurality of the second tap cells in the layout region of the semiconductor device such that the third and fourth contact regions are respectively located in a first conductivity type semiconductor layer and a second conductivity type semiconductor layer; and (d) successively placing a plurality of logic circuit cells in the layout region such that a plurality of impurity regions are located in the first conductivity type semiconductor layer and the second conductivity type semiconductor layer in which the first or second tap cell is placed.

According to the second aspect of the invention, the first tap cells including the first and second contact regions that have a longitudinal direction in a first direction, and the second tap cells including the third and fourth contact regions that have a longitudinal direction in a second direction are selectively placed in a layout region of a semiconductor device. Therefore, for example, in the case where a plurality of cell rows extend in the first direction, while the laying out of signal interconnects is made easier by routing signal interconnects that extend in the first direction through the first tap cell, the number of second tap cells is reduced by placing the second tap cells in a staggered placement in a plurality of cell rows in other regions, and as a result, the total layout area can be reduced.

Here, the layout design method of a semiconductor device may further include: (e) determining whether or not all logic circuit cells that constitute the semiconductor device have been placed in the layout region after step (d); and (f) if some of the logic circuit cells that constitute the semiconductor device have not been placed in the layout region, repeating steps (b) to (e) by inputting new placement information for designating a region in which a plurality of the first tap cells are to be placed. Therefore, even in a case where the laying out has not been completed based on the placement information that was input first, the laying out can be completed based on the new placement information.

BRIEF DESCRIPTION OF THE DRAWINGS

The invention will be described with reference to the accompanying drawings, wherein like numbers reference like elements.

DESCRIPTION OF EXEMPLARY EMBODIMENTS

Figure 1:
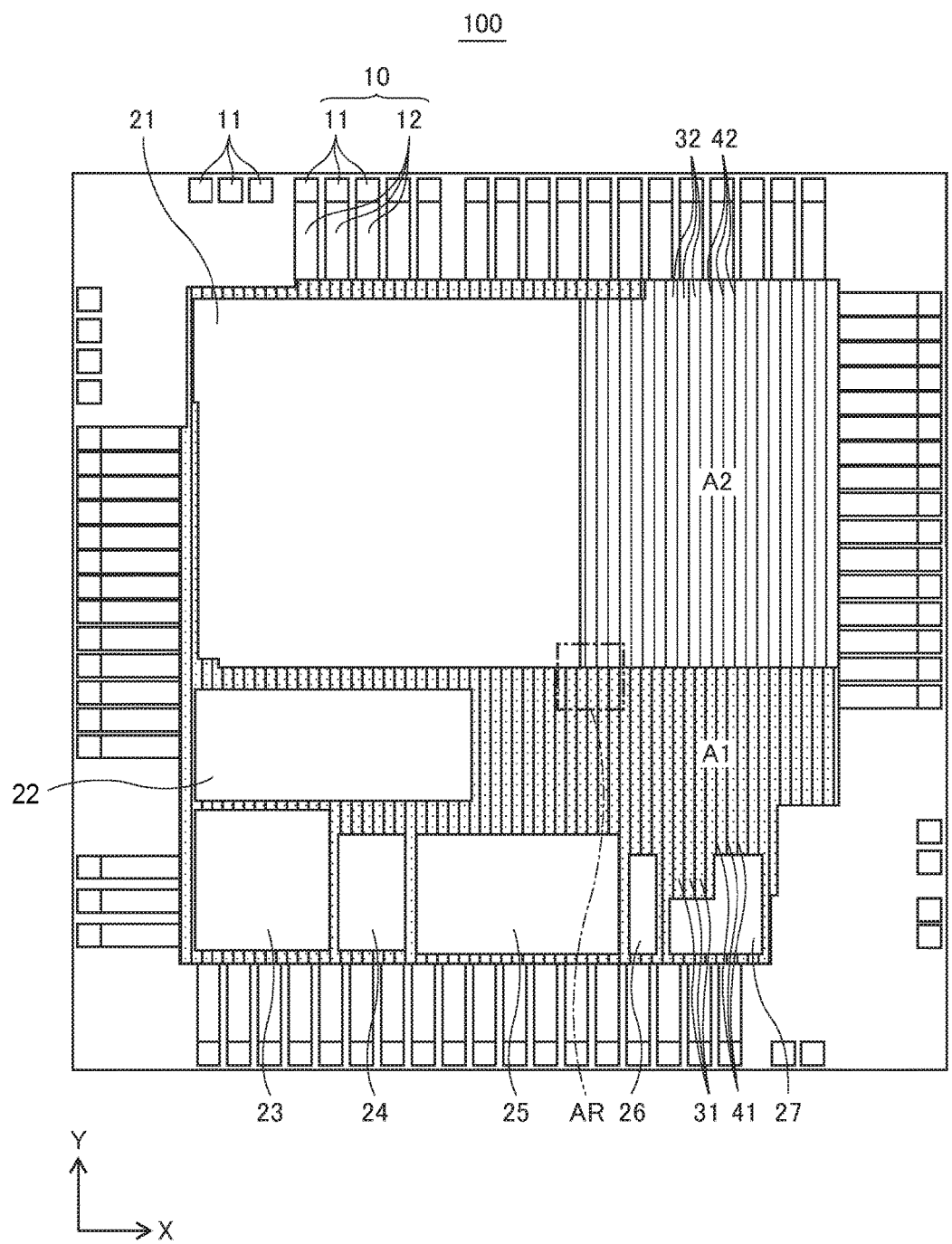
FIG. 1 is a plan view illustrating an exemplary layout of a semiconductor device according to one embodiment of the invention.

Hereinafter, embodiments of the invention will be described in detail with reference to the drawings. The same constituent elements are given the same reference numerals, and a redundant description is omitted.

Exemplary Layout of Semiconductor Device

FIG. 1 is a plan view illustrating an exemplary layout of a semiconductor device according to one embodiment of the invention. The semiconductor device includes a semiconductor chip 100 in which a plurality of circuit elements and a plurality of interconnects are formed in a semiconductor substrate. In the example shown in FIG. 1, a plurality of input/output cells (I/O cells) 10, at least one macrocell (a plurality of macrocells 21 to 27 are shown in FIG. 1), a plurality of standard cells 31 and 32, a plurality of first tap cells 41, and a plurality of second tap cells 42 are placed in the semiconductor chip 100.

The input/output cell 10 includes a terminal (pad) 11 such as a power supply terminal or an input/output terminal, and an input/output circuit 12 that receives or outputs a signal via the terminal 11 as necessary, and is provided for electrical connection with an external member. Each of the macrocells 21 to 27 includes a digital circuit or an analog circuit, and is a large scale circuit block for realizing a desired function.

Each of the standard cells 31 and 32 is a logic circuit cell that constitutes a logic circuit such as an inverter, a buffer, an AND circuit, a NAND circuit, an OR circuit, a NOR circuit, or flip-flop, for example. Each of the standard cells 31 and 32 includes a plurality of transistors and intra-cell interconnects for connecting these transistors, and a logic function of the semiconductor device can be realized by connecting the plurality of standard cells 31 and 32 with inter-cell interconnects.

The first tap cell 41 and the second tap cell 42 are provided to supply a high potential side power supply potential VDD and a low potential side power supply potential VSS to a semiconductor substrate, a well, or an epitaxial layer in which the standard cell 31 or 32 is placed. One of the high potential side power supply potential VDD and the low potential side power supply potential VSS may be a ground potential (0V).

Accordingly, the placement density of the first tap cells 41 and the second tap cells 42 is determined such that the ability to supply power to the semiconductor substrate, the well, or the like is secured. In the present embodiment, the first tap cell 41 and the second tap cell 42 having different shapes are selectively placed according to the state of signal interconnects in a region in which the tap cell is placed or a shape or the like of the region in which the tap cell is placed.

In the example shown in FIG. 1, the first tap cells 41 are placed in a region A1 of the semiconductor chip 100 along with the standard cells 31, and the second tap cells 42 are placed in a region A2 of the semiconductor chip 100 along with the standard cells 32. Note that, in FIG. 1, the boundaries between individual tap cells and standard cells are not shown, and a group of the tap cells 41 or 42 that are placed along a Y-axis direction in the region A1 or A2 are shown as line segments. Also, in regions between the plurality of line segments, a plurality of the standard cells 31 or 32 are placed in a plurality of cell rows extending in an X-axis direction.

Figure 2:
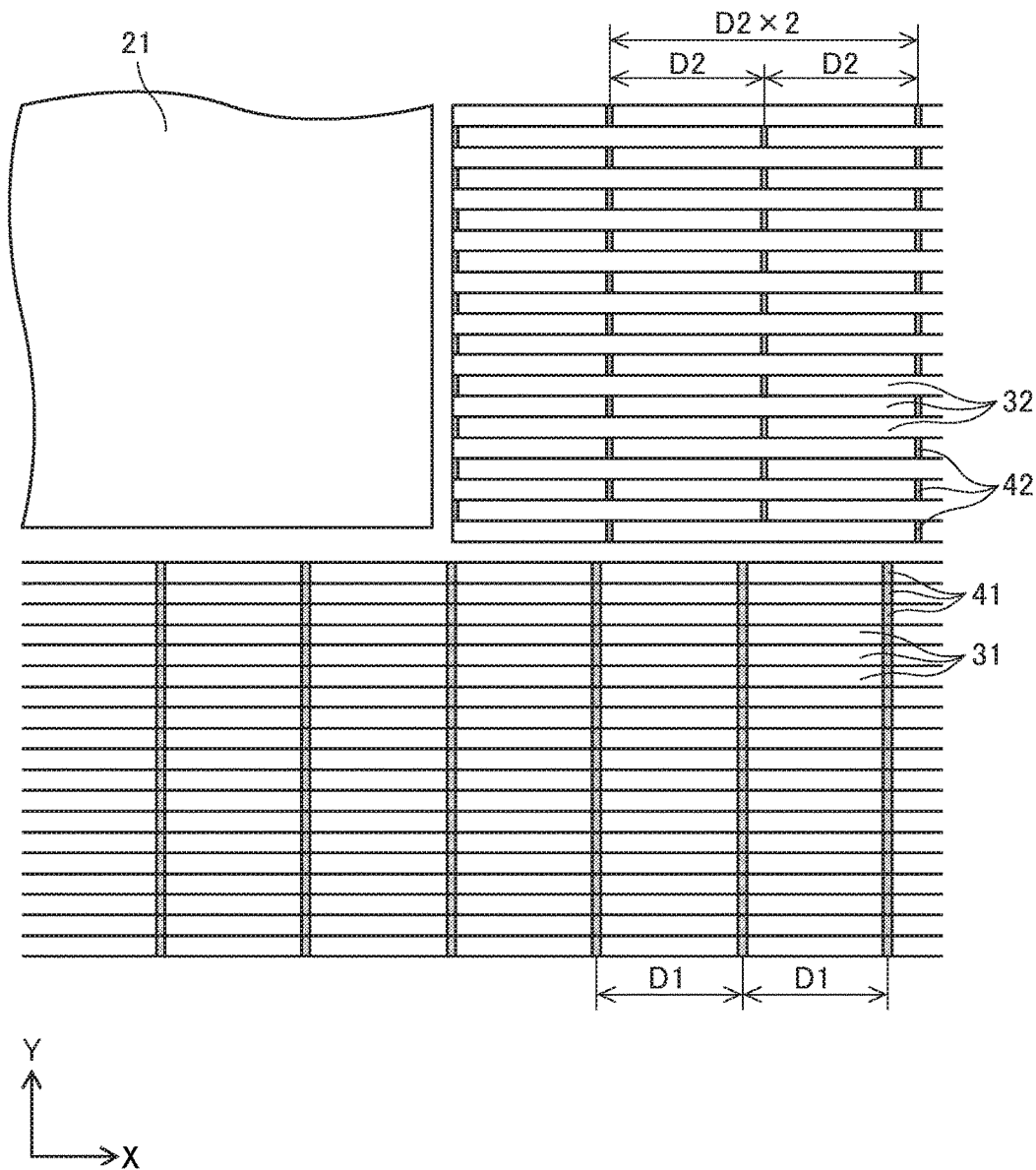
FIG. 2 is an enlarged plan view of a portion of the semiconductor device shown in FIG. 1.

FIG. 2 is an enlarged plan view of a portion of the semiconductor device shown in FIG. 1. A portion of the macrocell 21, and a plurality of the standard cells 31 and 32, a plurality of the first tap cells 41, and a plurality of the second tap cells 42 that are placed in a region AR in the semiconductor chip 100 shown in FIG. 1 are shown in FIG. 2. Note that, in FIG. 2, boundaries of individual standard cells are not shown, and a group of the standard cells 31 or 32 are placed along the X-axis direction in a region between two adjacent first tap cells 41 or second tap cells 42 in each of a plurality of cell rows extending in the X-axis direction.

The plurality of first tap cells 41 are placed with a first predetermined interval D1 at the same coordinates in a first direction (X-axis direction in the present embodiment), in the plurality of cell rows that extend in the first direction. Also, the plurality of second tap cells 42 are placed alternatingly between two adjacent cell rows at a second predetermined interval D2, in a plurality of cell rows that extend in the first direction. Accordingly, in one cell row, a plurality of the second tap cells 42 are placed at an interval (D2×2) that is twice the second predetermined interval D2. In the present application, such a placement is referred to as staggered placement.

Accordingly, the laying out of signal interconnects is made easier by causing a signal interconnect that extends in a second direction (Y-axis direction orthogonal to the X-axis direction in the present embodiment) that is different from the first direction to pass above the plurality of first tap cells 41, and the interval of the second tap cells 42 in each cell row can be made twice the second predetermined interval D2.

In the example shown in FIG. 2, while the second predetermined interval D2 is slightly larger than the first predetermined interval D1, the first predetermined interval D1 and the second predetermined interval D2 are substantially the same. In this case, in each cell row, the placement interval of the second tap cells 42 is approximately twice the placement interval of the first tap cells 41. Accordingly, in the region A2 (FIG. 1) in which the second tap cells 42 are placed, the number of tap cells per unit area is approximately half compared with the region A1 (FIG. 1) in which the first tap cells 41 are placed.

Exemplary Layout of Cell

Figure 3:
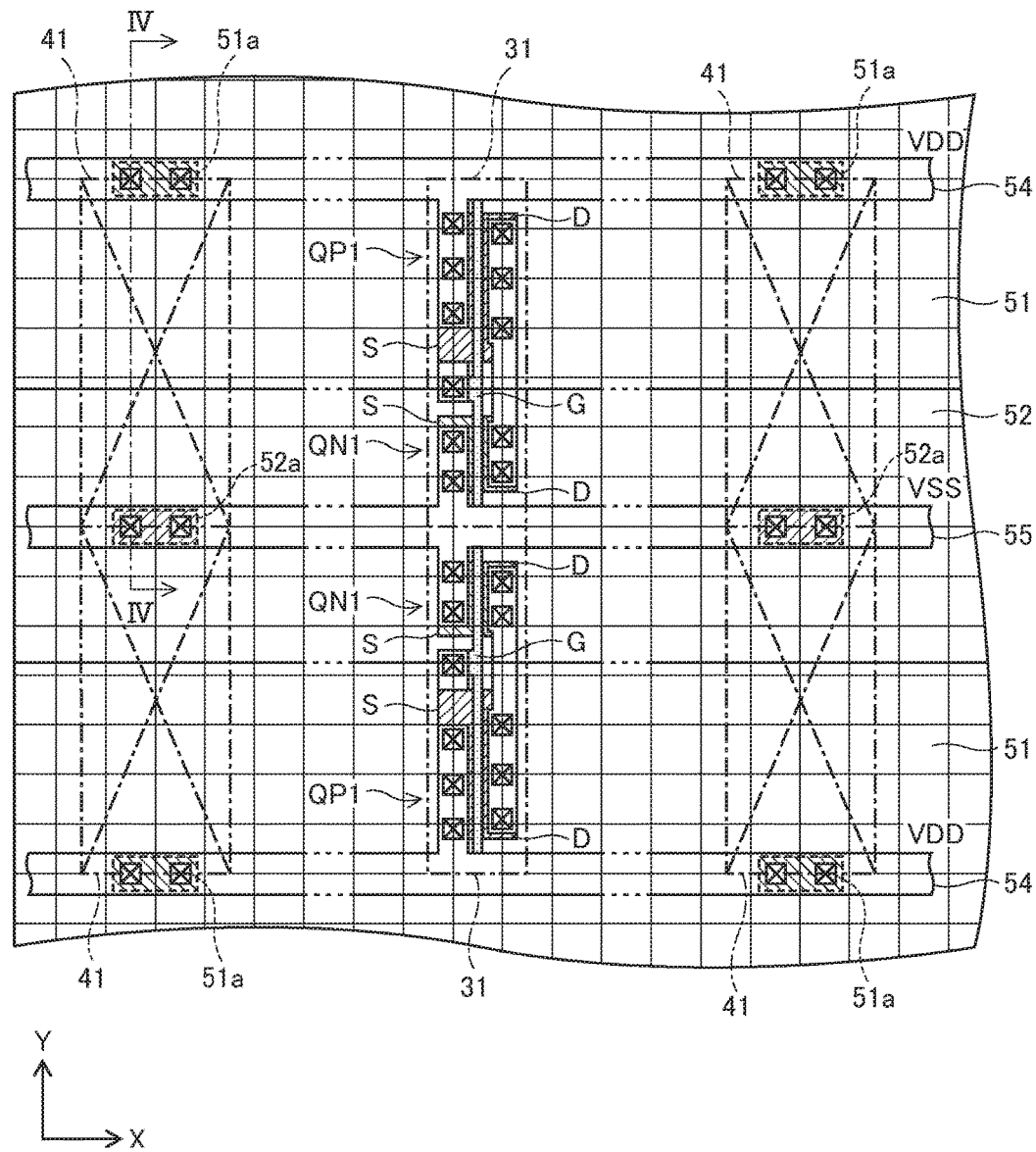
FIG. 3 is a plan view illustrating an exemplary layout of a standard cell and a first tap cell.
Figure 4:
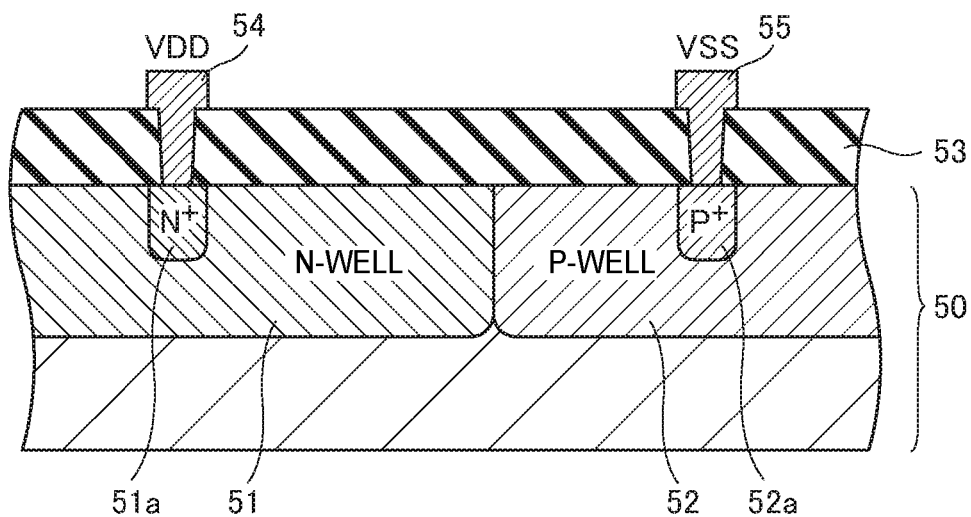
FIG. 4 is a cross-sectional view taken along line IV-IV in the first tap cell shown in FIG. 3.

FIG. 3 is a plan view illustrating an exemplary layout of the standard cell and the first tap cell shown in FIG. 2. FIG. 4 is a cross-sectional view taken along line IV-IV in the first tap cell shown in FIG. 3. In general, one first tap cell is provided corresponding to a plurality of standard cells, and a portion of the standard cells is shown in FIG. 3.

Also, grids with reference to which the layout of a semiconductor device is designed are shown in FIG. 3 in order to clarify the sizes of cells. In the present application, the size of each cell, in the standard cells and the tap cells, in a longitudinal direction (Y-axis direction in the diagram) is referred to as "length" of the cell, and the size of each cell in a direction (X-axis direction in the diagram) orthogonal to the longitudinal direction is referred to as "width" of the cell. In the example shown in FIG. 3, a standard cell 31 is a first logic circuit cell that constitutes an inverter, and has a length of 7 grids and a width of 2 grids. Also, the first tap cell 41 has a length of 7 grids and a width of 3 grids.

The semiconductor chip 100 (FIG. 1) includes a semiconductor substrate 50 (FIG. 4) made of a semiconductor material such as silicon including N-type or P-type impurities, an N-well 51, which is a first semiconductor layer, and a P-well 52, which is a second semiconductor layer, that are arranged in the semiconductor substrate 50. Note that, in the case where an N-type semiconductor substrate or an epitaxial layer is used as the first semiconductor layer, the N-well 51 may be omitted. In the case where a P-type semiconductor substrate or an epitaxial layer is used as the second semiconductor layer, the P-well 52 may be omitted.

The standard cell 31 includes a P-channel MOS transistor QP1 provided in the N-well 51 and an N-channel MOS transistor QN1 provided in the P-well 52. The transistor QP1 includes a source (S) and a drain (D) that are constituted by a plurality of P-type impurity regions arranged in the N-well 51, and a gate electrode (G) arranged on the semiconductor substrate 50 via a gate insulating film.

Also, the transistor QN1 includes a source (S) and a drain (D) that are constituted by a plurality of N-type impurity regions arranged in the P-well 52, and a gate electrode (G) arranged on the semiconductor substrate 50 via a gate insulating film. The gate electrodes (G) of the transistors QP1 and QN1 are connected.

An interconnect layer including a plurality of interconnects is arranged on the semiconductor substrate 50 in which the transistors QP1 and QN1 and the like are formed via an interlayer insulating film 53 (FIG. 4). The marks "×" in FIG. 3 indicate the positions of contact holes formed in the interlayer insulating film 53. The interconnects arranged on the interlayer insulating film 53 are electrically connected to impurity regions in the semiconductor substrates 50 via contact holes.

Furthermore, the semiconductor chip 100 (FIG. 1) may have a multilevel interconnect structure by repeatedly arranging the interlayer insulating film and the interconnect layer as necessary. In this case, interconnects that extend in the first direction are mainly arranged in an odd-numbered interconnect layer, and interconnects that extend in the second direction are mainly arranged in an even-numbered interconnect layer, for example. A first power supply interconnect 54 to which the power supply potential VDD is supplied and a second power supply interconnect 55 to which the power supply potential VSS is supplied are desirably arranged in the first interconnect layer.

The transistor QP1 has a source (S) electrically connected to the first power supply interconnect 54, a drain (D) electrically connected to an output signal interconnect, and a gate electrode (G) electrically connected to an input signal interconnect. Also, the transistor QN1 has a drain (D) electrically connected to the output signal interconnect, a source (S) electrically connected to the second power supply interconnect 55, and a gate electrode (G) electrically connected to the input signal interconnect. The inverter constituted by the transistors QP1 and QN1 inverts the level of an input signal supplied via the input signal interconnect, and outputs an output signal having an inverted level to the output signal interconnect.

The first tap cell 41 includes a first contact region 51a that is arranged in the N-well 51 and has a longitudinal direction in the first direction, and a second contact region 52a that is arranged in the P-well 52 and has a longitudinal direction in the first direction. The first contact region 51a is an N-type impurity region with a higher concentration than another region in the N-well 51, and the second contact region 52a is a P-type impurity region with a higher concentration than another region in the P-well 52.

Also, the first tap cell 41 further includes the first power supply interconnect 54 and the second power supply interconnect 55 that are arranged in parallel along the first direction. The first power supply interconnect 54 is electrically connected to the first contact region 51a and supplies the power supply potential VDD to the N-well 51. Also, the second power supply interconnect 55 is electrically connected to the second contact region 52a and supplies the power supply potential VSS to the P-well 52.

According to such an arrangement, the first power supply interconnect 54 is electrically connected to the first contact region 51a via a plurality of contact holes formed in the interlayer insulating film 53 side by side in the first direction, and the second power supply interconnect 55 is electrically connected to the second contact region 52a via a plurality of contact holes formed in the interlayer insulating film 53 side by side in the first direction, and as a result, the ability to supply power to the N-well 51 and the P-well 52 can be improved.

Figure 5:
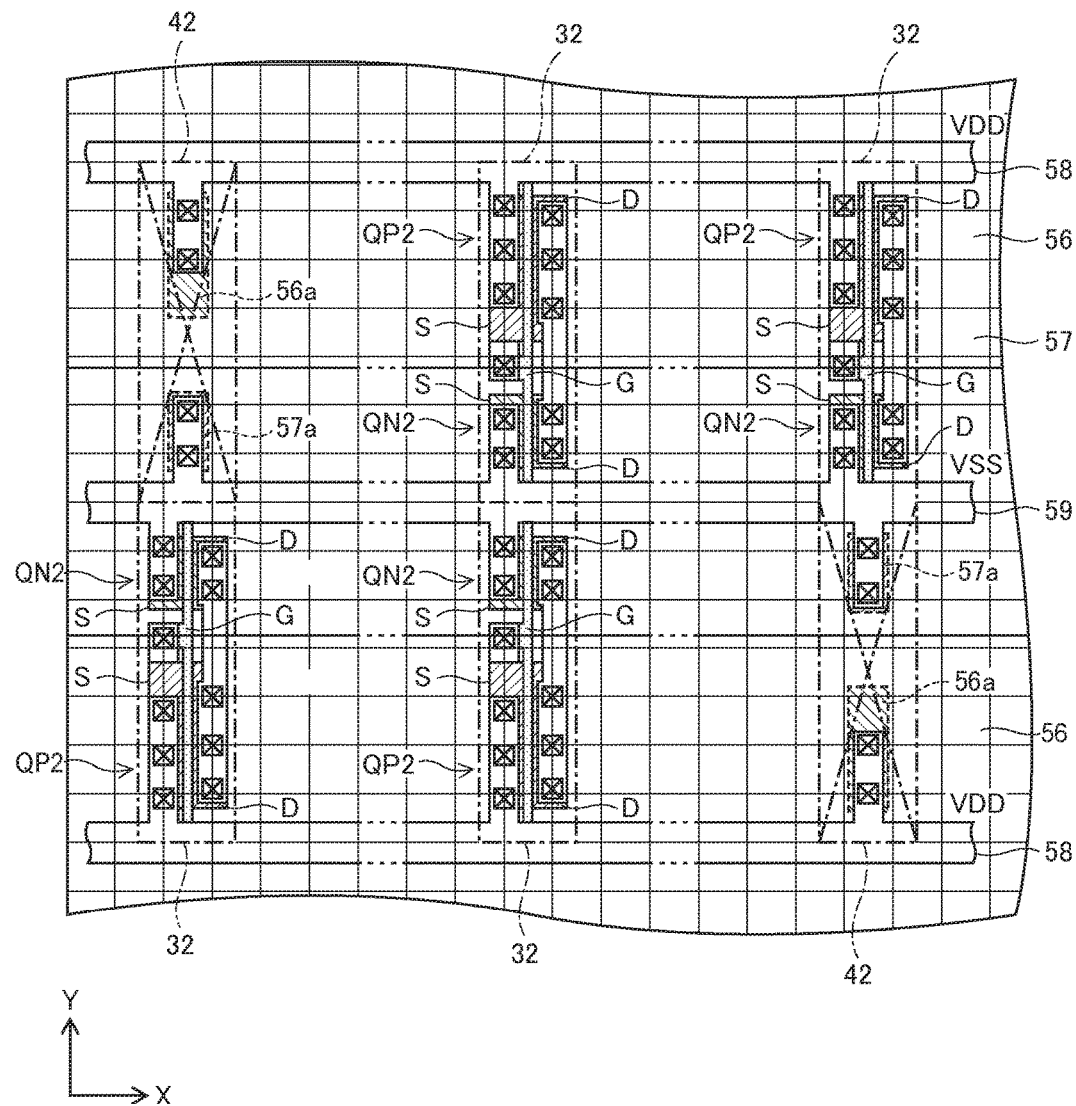
FIG. 5 is a plan view illustrating an exemplary layout of a standard cell and a second tap cell.

FIG. 5 is a plan view illustrating an exemplary layout of the standard cell and the second tap cell shown in FIG. 2. In general, one second tap cell is provided corresponding to a plurality of standard cells. A portion of the standard cells is shown in FIG. 5.

In the example shown in FIG. 5, the standard cell 32 is a second logic circuit cell that constitutes an inverter, and has a length of 7 grids and a width of 2 grids similarly to the standard cell 31 shown in FIG. 3. Also, the second tap cell 42 has contact regions and interconnects that have different shapes from those in the first tap cell 41 shown in FIG. 3, and has a length of 7 grids and a width of 2 grids.

The semiconductor chip 100 (FIG. 1) further includes an N-well 56, which is a third semiconductor layer, and a P-well 57, which is a fourth semiconductor layer, that are arranged in the semiconductor substrate 50 (FIG. 4). Note that, in the case where an N-type semiconductor substrate or an epitaxial layer is used as the third semiconductor layer, the N-well 56 may be omitted. In the case where a P-type semiconductor substrate or an epitaxial layer is used as the fourth semiconductor layer, the P-well 57 may be omitted.

The standard cell 32 includes a P-channel MOS transistor QP2 provided in the N-well 56 and an N-channel MOS transistor QN2 provided in the P-well 57. The transistor QP2 includes a source (S) and a drain (D) that are constituted by a plurality of P-type impurity regions arranged in the N-well 56, and a gate electrode (G) arranged on the semiconductor substrate 50 via a gate insulating film.

Also, the transistor QN2 includes a source (S) and a drain (D) that are constituted by a plurality of N-type impurity regions arranged in the P-well 57, and a gate electrode (G) arranged on the semiconductor substrate 50 via a gate insulating film. The gate electrodes (G) of the transistors QP2 and QN2 are connected.

The marks "×" in FIG. 5 indicate the positions of contact holes formed in the interlayer insulating film 53 (FIG. 4). In the case where the semiconductor chip 100 (FIG. 1) includes a multilevel interconnect structure, a third power supply interconnect 58 to which the power supply potential VDD is supplied and a fourth power supply interconnect 59 to which the power supply potential VSS is supplied are desirably arranged in the first interconnect layer.

The transistor QP2 has a source (S) electrically connected to the third power supply interconnect 58, a drain (D) electrically connected to an output signal interconnect, and a gate electrode (G) electrically connected to an input signal interconnect. Also, the transistor QN2 has a drain (D) electrically connected to the output signal interconnect, a source (S) electrically connected to the fourth power supply interconnect 59, and a gate electrode (G) electrically connected to the input signal interconnect. The inverter constituted by the transistors QP2 and QN2 inverts the level of an input signal supplied via the input signal interconnect, and outputs an output signal having an inverted level to the output signal interconnect.

The second tap cell 42 includes a third contact region 56a that is arranged in the N-well 56 and has a longitudinal direction in the second direction, and a fourth contact region 57a that is arranged in the P-well 57 and has a longitudinal direction in the second direction. The third contact region 56a is an N-type impurity region having a higher concentration than another region in the N-well 56, and the fourth contact region 57a is a P-type impurity region having a higher concentration than another region in the P-well 57.

Also, the second tap cell 42 further includes the third power supply interconnect 58 and the fourth power supply interconnect 59 that are arranged in parallel along the first direction. The third power supply interconnect 58 has a portion that is branched in the second direction and is electrically connected to the third contact region 56a via the branched portion, and supplies the power supply potential VDD to the N-well 56. Also, the fourth power supply interconnect 59 has a portion that is branched in the second direction and is electrically connected to the fourth contact region 57a via the branched portion, and supplies the power supply potential VSS to the P-well 57.

According to such an arrangement, the third power supply interconnect 58 is electrically connected to the third contact region 56a via the plurality of contact holes formed in the interlayer insulating film 53 side by side in the second direction, and the fourth power supply interconnect 59 is electrically connected to the fourth contact region 57a via the plurality of contact holes formed in the interlayer insulating film 53 side by side in the second direction, and as a result, the ability to supply power to the N-well 56 and the P-well 57 can be improved.

When FIG. 3 and FIG. 5 are compared, in the first tap cell 41, the first contact region 51a and the second contact region 52a each have a longitudinal direction in the first direction, and as a result, the first power supply interconnect 54 and the second power supply interconnect 55 do not protrude toward the inside of the tap cell. Therefore, in the case where a signal interconnect is routed so as to pass through the first tap cell 41 in the first interconnect layer, the first power supply interconnect 54 and the second power supply interconnect 55 do not interfere with the signal interconnect.

On the other hand, in the second tap cell 42, the third contact region 56a and the fourth contact region 57a each have a longitudinal direction in the second direction, and as a result, the third power supply interconnect 58 and the fourth power supply interconnect 59 each have a protruding portion that protrudes toward the inside of the tap cell. These protruding portions are electrically connected to the third contact region 56a and the fourth contact region 57a via the contact holes provided in the interlayer insulating film.

Therefore, the standard cells 32 can be placed under the left second tap cell 42 shown in FIG. 5, and above the right second tap cell 42. As a result of placing the second tap cells 42 in a staggered placement, the number of second tap cells 42 that are placed per unit area can be reduced. Accordingly, the number of standard cells 32 that are placed per unit area can be increased, and the efficiency of placing the standard cells 32 can be improved.

From the above, the first tap cell 41 is desirably placed in regions in which signal interconnects that extend in the first direction are dominant over signal interconnects that extend in the second direction. In these regions, signal interconnects that extend in the first direction can be routed so as to pass through the first tap cell 41, and the laying out of the signal interconnects can be made easier.

Regions in which the average length of signal interconnects that extend in the first direction is longer than the average length of signal interconnects that extend in the second direction in all the interconnect layers, or regions in which the number of signal interconnects that extend in the first direction and have a length that is greater than or equal to a predetermined length is larger than the number of signal interconnects that extend in the second direction and have a length that is greater than or equal to the predetermined length in all of the interconnect layers correspond to such a region, for example. The region in which the standard cells 31 are placed under the macrocell 21 in FIG. 2 corresponds to such a region.

Also, the first tap cell 41 is desirably placed in a region that is a region between a macrocell and a plurality of input/output cells or another macrocell and has an aspect ratio that is greater than or equal to a predetermined value. In such a region, a signal interconnect that electrically connects the macrocell and the plurality of input/output cells or the other macrocell is routed through the first tap cell 41, and as a result, the laying out of signal interconnects can be made easier.

The predetermined value may be set in a range from 5 to 20. For example, in the case where the predetermined value is 10, in FIG. 1, a region between the macrocell 21 and a plurality of input/output cells 10 thereabove, a region between the macrocell 21 and a plurality of input/output cells 10 on the left side, a region between the macrocell 21 and the macrocell 22, and the like correspond to the region having an aspect ratio that is greater than or equal to the predetermined value.

Alternatively, the first tap cell 41 is desirably placed in a region that is a region between a macrocell and a plurality of input/output cells or another macrocell, and has a width that is less than or equal to a predetermined width. In such a region, a signal interconnect that electrically connects the macrocell and the plurality of input/output cells or the other macrocell is routed through the first tap cell 41, and as a result, the laying out of signal interconnects can be made easier. Note that, in the present application, the "width" of a region referred to the size in a direction orthogonal to the longitudinal direction of the region.

The predetermined width may be set in a range from 1/10 to 1/50 of one side (short side in a case of rectangle) of a principal surface (surface shown in FIG. 1) in the semiconductor chip 100. For example, in the case where the predetermined width is 1/50 of one side of the principal surface of the semiconductor chip 100, in FIG. 1, a region between the macrocell 23 and a plurality of input/output cells 10 on the left side, a region between the macrocell 23 and a plurality of input/output cells 10 thereunder, and a region between the macrocell 23 and a plurality of input/output cells 10 thereunder, and the like correspond to a region having a width that is less than or equal to the predetermined width.

Furthermore, the first tap cell 41 is desirably placed in a corner region that is surrounded by a plurality of regions in which the first tap cells 41 are placed. For example, in FIG. 1, a region on the upper left side of the macrocell 21, a region on the lower left side of the macrocell 23, and the like correspond to such a corner region.

According to the present embodiment, the first tap cell 41 including the first contact region 51a and the second contact region 52a that have a longitudinal direction in the first direction and the second tap cell 42 including the third contact region 56a and the fourth contact region 57a that have a longitudinal direction in the second direction are provided separate from the standard cells 31 and 32.

Therefore, for example, in the case where a plurality of cell rows extend in the first direction, while the laying out of signal interconnects is made easier by routing signal interconnects that extend in the first direction through the first tap cell 41, the number of second tap cells 42 is reduced by placing the second tap cells 42 in a staggered placement in a plurality of cell rows in other regions, and as a result, the total layout area can be reduced.

Layout Design System

Next, a layout design system for implementing a layout design method of a semiconductor device according to one embodiment of the invention will be described.

Figure 6:
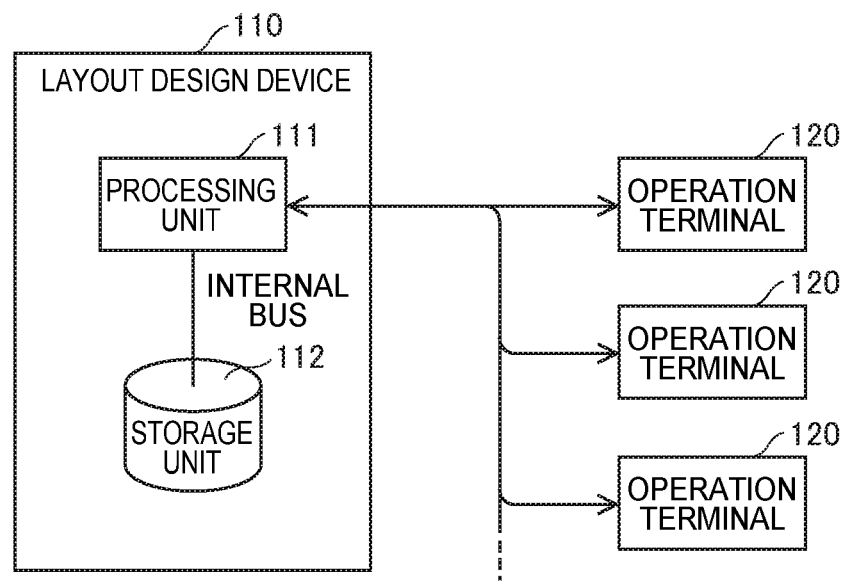
FIG. 6 is a block diagram illustrating an exemplary configuration of a layout design system.

FIG. 6 is a block diagram illustrating an exemplary configuration of the layout design system. As shown in FIG. 6, the layout design system includes a layout design device 110 and at least one operation terminal 120 that is connected to the layout design device 110 via a network. The layout design device 110 includes a processing unit 111 including a central processing device (CPU) and a storage unit 112 that is connected to the processing unit 111 via an internal bus.

The storage unit 112 stores software (layout design program) for causing the CPU of the processing unit 111 to execute various types of processing and a database that includes layout data of various types of cells and circuit elements and the like. A hard disk, a flexible disk, an MO, an MT, various memories, a CD-ROM, or a DVD-ROM can be used as a recording medium in the storage unit 112.

Upon an operator accessing the layout design device 110 by operating the operation terminal 120, the processing unit 111 of the layout design device 110 transmits image data representing a layout region of a semiconductor device to the operation terminal 120. The operation terminal 120 displays an image of the layout region of the semiconductor device in a display unit based on the received image data.

The processing unit 111 of the layout design device 110 reads out necessary layout data from the storage unit 112 according to the operation made by the operator using the operation terminal 120. The processing unit 111 places circuit elements and intra-cell interconnects of a plurality of cells in a layout region, and furthermore places inter-cell interconnects for connecting the plurality of cells in the layout region, and as a result, layout design of the semiconductor device is performed.

Layout Design Method

Next, a layout design method of a semiconductor device according to one embodiment of the invention will be described with reference to FIGS. 1, 3, and 5 to 7. The layout design method is a method of designing a layout of a semiconductor device using the first tap cell 41 shown in FIG. 3 and the second tap cell 42 shown in FIG. 5, and is used in the layout design system shown in FIG. 6.

As shown in FIG. 3, the first tap cell 41 includes the first contact region 51*a* and the second contact region 52*a* having a longitudinal direction in the first direction. Also, as shown in FIG. 5, the second tap cell 42 includes the third contact region 56*a* and the fourth contact region 57*a* having a longitudinal direction in the second direction that is different from the first direction. In the following, a case where a layout of the semiconductor device shown in FIG. 1 is designed will be described, as an example.

A circuit design of the semiconductor device is performed as a previous step of the layout design, and a netlist is created. The netlist includes information for specifying a plurality of standard cells that constitute a plurality of logic circuits that realize the logic function of the semiconductor device, and information for specifying a connection relationship between these standard cells.

The created netlist is stored in the storage unit 112 of the layout design device 110 shown in FIG. 6, and the CPU of the processing unit 111, which operates in accordance with the layout design program, performs the layout design of the semiconductor device based on the netlist. In this case, the layout data of the input/output cell 10, the macrocells 21 to 27, the standard cells 31 and 32, the first tap cell 41, the second tap cell 42, which are shown in FIG. 1, and the like are used.

Figure 7:
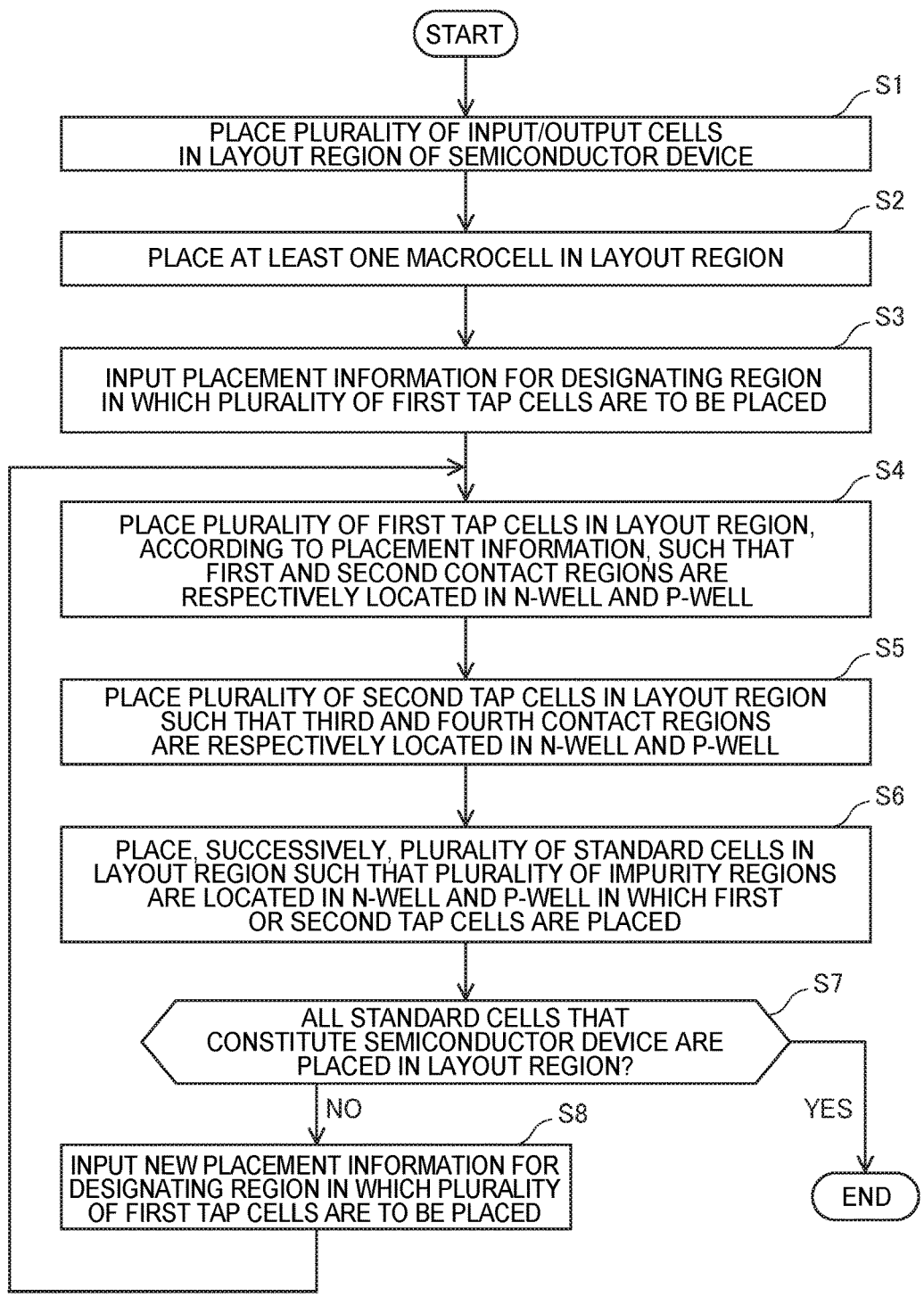
FIG. 7 is a flowchart illustrating a layout design method according to one embodiment of the invention.

FIG. 7 is a flowchart illustrating a layout design method of a semiconductor device according to one embodiment of the invention. In step S1 shown in FIG. 7, the processing unit 111 of the layout design device 110 shown in FIG. 6 places the plurality of input/output cells 10 shown in FIG. 1 in a layout region of the semiconductor device. Accordingly, the positions of the sources, drains, and gate electrodes of a plurality of transistors included in the input/output cells 10 are determined, and the positions of a plurality of interconnects inside the input/output cells 10 are determined.

In step S2, the processing unit 111 of the layout design device 110 places at least one macrocell (plurality of macrocells 21 to 27, in the example shown in FIG. 1) in the layout region. Therefore, the positions of the sources, drains, and gate electrodes of a plurality of transistors included in the macrocells 21 to 27 are determined, and the positions of a plurality of interconnects inside the macrocells 21 to 27 are determined.

Next, the operator designates a region in which a plurality of the first tap cells 41 are to be placed by operating the operation terminal 120 shown in FIG. 6. For example, the operator uses a mouse or the like to designate a plurality of coordinates for specifying a region in which the plurality of first tap cells 41 are to be placed in an image of the layout region of the semiconductor device displayed on the display unit of the operation terminal 120.

The operation terminal 120 outputs placement information for designating the region in which the plurality of first tap cells 41 are to be placed to the layout design device 110. Therefore, in step S3, the processing unit 111 of the layout design device 110 receives the input of the placement information for designating the region in which the plurality of first tap cells 41 are to be placed from the operation terminal 120.

In step S4, the processing unit 111 of the layout design device 110 places the plurality of first tap cells 41 according to the placement information in the layout region in accordance with a predetermined rule such that the first contact regions 51*a* and the second contact regions 52*a* are respectively located in the N-well 51 and the P-well 52.

Therefore, the plurality of first tap cells 41 are placed in the region, in the layout region, designated by the placement information, and the positions of the first contact regions 51*a* and the second contact regions 52*a* included in the plurality of first tap cells 41 and the first power supply interconnect 54 and second power supply interconnect 55 are determined.

Here, the predetermined rule is determined such that the ability to supply power to the N-well 51 and the P-well 52 is secured, and is a rule that distances between positions in the N-well 51 and the first contact region 51*a* are less than or equal to a predetermined distance, and distances between positions in the P-well 52 and the second contact region 52*a* are less than or equal to a predetermined distance, for example.

In step S5, the processing unit 111 of the layout design device 110 places a plurality of the second tap cells 42 in the layout region in accordance with a predetermined rule such that the third contact regions 56*a* and the fourth contact regions 57*a* are respectively located in the N-well 56 and the P-well 57.

Therefore, the plurality of second tap cells 42 are placed in a region, in the layout region, in which cells are not yet placed, and the positions of the third contact regions 56*a* and the fourth contact regions 57*a* included in the plurality of second tap cells 42 and the third power supply interconnect 58 and the fourth power supply interconnect 59 are determined.

Here, the predetermined rule is determined such that the ability to supply power to the N-well 56 and the P-well 57 is secured, and is a rule that distances between positions in the N-well 56 and the third contact region 56*a* are less than or equal to a predetermined distance, and distances between positions in the P-well 57 and the fourth contact region 57a are less than or equal to a predetermined distance, for example.

In step S6, the processing unit 111 of the layout design device 110 successively places a plurality of the standard cells 31 and 32 in the layout region such that a plurality of impurity regions are located in the N-well 51 and the P-well 52 in which the first tap cells 41 are placed or in the N-well 56 and P-well 57 in which the second tap cells 42 are placed. At this time, the processing unit 111 of the layout design device 110 determines the placement of interconnects with which the standard cells 31 or 32 placed in the layout region are connected to another cell.

Therefore, the plurality of standard cells 31 and 32 are placed in a region, in the layout region, in which cells are not yet placed, and the positions of the sources, drains, and gate electrodes of a plurality of transistors included in the plurality of standard cells 31 and 32 are determined. Also, the positions of a plurality of interconnects inside the plurality of standard cells 31 and 32, and positions of a plurality of interconnects with which the plurality of standard cells 31 and 32 are connected to other cells are determined.

In step S7, after step S6, the processing unit 111 of the layout design device 110 determines whether or not all of the standard cells that constitute the semiconductor device have been placed in the layout region. If all of the standard cells that constitute the semiconductor device have been placed in the layout region, the processing ends.

On the other hand, if some of the standard cells that constitute the semiconductor device have not been placed in the layout region, a notification indicating this is displayed in the display unit of the operation terminal 120. The operator again designates a region in which a plurality of the first tap cells 41 are to be placed by operating the operation terminal 120. The operation terminal 120 outputs new placement information for designating the region in which the plurality of first tap cells 41 are to be placed to the layout design device 110. Therefore, in step S8, the processing unit 111 of the layout design device 110 receives the input of new placement information for designating the region in which the plurality of first tap cells 41 are to be placed from the operation terminal 120.

Thereafter, the processing returns to step S4, and the processing unit 111 of the layout design device 110 repeats steps S4 to S7. Therefore, even in a case where the layout has not been completed based on the placement information that was input first, the layout can be completed based on the new placement information.

According to the present embodiment, the first tap cell 41 including the first contact region 51a and the second contact region 52a that have a longitudinal direction in the first direction and the second tap cell 42 including the third contact region 56a and the fourth contact region 57a that have a longitudinal direction in the second direction are selectively placed in the layout region of the semiconductor device.

Therefore, for example, in the case where a plurality of cell rows extend in the first direction, while the laying out of signal interconnects is made easier by routing signal interconnects that extend in the first direction through inside the first tap cell 41, the number of second tap cells is reduced by placing the second tap cells 42 in a staggered placement in a plurality of cell rows in other regions, and as a result, the total layout area can be reduced.

In the embodiment described above, the case where the semiconductor device includes at least one macrocell has been described, but the invention can be applied to a semiconductor device that does not include a macrocell. In this way, the invention is not limited to the embodiment described above, and many modifications can be made within the technical idea of the invention by a person having ordinary skill in the art.

What is claimed is:

1. A semiconductor device comprising:
    a first logic circuit cell including a plurality of impurity regions that are arranged in a first conductivity type first semiconductor layer and a second conductivity type second semiconductor layer;
    a first tap cell including a first contact region and a second contact region that are respectively arranged in the first and second semiconductor layers and have a longitudinal direction in a first direction;
    a second logic circuit cell including a plurality of impurity regions that are arranged in a first conductivity type third semiconductor layer and a second conductivity type fourth semiconductor layer; and
    a second tap cell including a third contact region and a fourth contact region that are respectively arranged in the third and fourth semiconductor layers and have a longitudinal direction in a second direction that is different from the first direction.

2. The semiconductor device according to claim 1, wherein the first tap cell further includes a first power supply interconnect and a second power supply interconnect that are arranged in parallel along the first direction, the first power supply interconnect being electrically connected to the first contact region, and the second power supply interconnect being electrically connected to the second contact region, and
    the second tap cell further includes a third power supply interconnect and a fourth power supply interconnect that are arranged in parallel along the first direction, the third power supply interconnect having a portion branched in the second direction so as to be electrically connected to the third contact region, and the fourth power supply interconnect having a portion branched in the second direction so as to be electrically connected to the fourth contact region.

3. The semiconductor device according to claim 1, wherein the first tap cell is placed in a region in which signal interconnects extending in the first direction are dominant over signal interconnects extending in the second direction.

4. The semiconductor device according to claim 1, further comprising a macrocell and a plurality of input/output cells,
    wherein the first tap cell is placed in a region that is a region between the macrocell and the plurality of input/output cells or another macrocell, and has an aspect ratio that is greater than or equal to a predetermined value.

5. The semiconductor device according to claim 1, further comprising a macrocell and a plurality of input/output cells,
    wherein the first tap cell is placed in a region that is a region between the macrocell and the plurality of input/output cells or another macrocell, and has a width that is less than or equal to a predetermined width.

6. The semiconductor device according to claim 1,
    wherein a plurality of the first tap cells are placed with a first predetermined interval at the same coordinates in the first direction, in a plurality of cell rows that extend in the first direction, and
    a plurality of the second tap cells are placed alternatingly between two adjacent cell rows at a second predetermined interval, in a plurality of cell rows that extend in the first direction.

7. A layout design method of a semiconductor device using a first tap cell including a first contact region and a second contact region that have a longitudinal direction in a first direction, and a second tap cell including a third contact region and a fourth contact region that have a longitudinal direction in a second direction that is different from the first direction, the layout design method comprising:
  (a) inputting placement information for designating a region in which a plurality of the first tap cells are to be placed;
  (b) placing the plurality of first tap cells in a layout region of the semiconductor device such that the first and second contact regions are respectively located in a first conductivity type semiconductor layer and a second conductivity type semiconductor layer, according to the placement information;
  (c) placing a plurality of the second tap cells in the layout region of the semiconductor device such that the third and fourth contact regions are respectively located in a first conductivity type semiconductor layer and a second conductivity type semiconductor layer; and
  (d) successively placing a plurality of logic circuit cells in the layout region such that a plurality of impurity regions are located in the first conductivity type semiconductor layer and the second conductivity type semiconductor layer in which the first or second tap cell is placed.

8. The layout design method of a semiconductor device according to claim 7, further comprising:
  (e) determining whether or not all logic circuit cells that constitute the semiconductor device have been placed in the layout region after step (d); and
  (f) if some of the logic circuit cells that constitute the semiconductor device have not been placed in the layout region, repeating steps (b) to (e) by inputting new placement information for designating a region in which a plurality of the first tap cells are to be placed.

* * * * *